(12) United States Patent
Zhang et al.

(10) Patent No.: US 10,571,639 B2
(45) Date of Patent: Feb. 25, 2020

(54) OPTICAL MODULE

(71) Applicants: Hisense Broadband Multimedia Technologies Co., Ltd., Qingdao, Shandong (CN); Hisense Broadband Multimedia Technologies, Ltd., Tortola (VG)

(72) Inventors: Qiang Zhang, Shandong (CN); Qisheng Zhao, Shandong (CN)

(73) Assignees: Hisense Broadband Multimedia Technologies Co., Ltd., Qingdao (CN); Hisense Broadband Multimedia Technologies, Ltd., Tortola (VG)

( * ) Notice: Subject to any disclaimer, the term of this patent is extended or adjusted under 35 U.S.C. 154(b) by 0 days.

(21) Appl. No.: 16/356,962

(22) Filed: Mar. 18, 2019

(65) Prior Publication Data

US 2019/0212510 A1 Jul. 11, 2019

Related U.S. Application Data

(63) Continuation-in-part of application No. 15/394,659, filed on Dec. 29, 2016, now Pat. No. 10,254,162.

(30) Foreign Application Priority Data

Sep. 9, 2016 (CN) .......................... 2016 1 0813775

(51) Int. Cl.
| | |
|---|---|
| *G01J 1/44* | (2006.01) |
| *H01L 31/103* | (2006.01) |
| *G02B 6/42* | (2006.01) |
| *H01L 31/107* | (2006.01) |
| *H04B 10/69* | (2013.01) |

(52) U.S. Cl.
CPC .............. *G02B 6/4279* (2013.01); *G01J 1/44* (2013.01); *H01L 31/103* (2013.01); *H01L 31/107* (2013.01); *G01J 2001/4406* (2013.01); *H04B 10/6911* (2013.01)

(58) Field of Classification Search
CPC ... G02B 6/4279; H01L 31/103; H01L 31/107; G01J 1/44; G01J 2001/4406; H04B 10/6911; H04B 10/691; H04B 10/693
USPC .......................................... 250/214 A, 214.1
See application file for complete search history.

(56) References Cited

U.S. PATENT DOCUMENTS

| | | | | |
|---|---|---|---|---|
| 4,355,271 | A * | 10/1982 | Noack .................. | B60Q 1/1423 15/250.17 |
| 6,649,900 | B2 * | 11/2003 | Filkins ..................... | H03F 3/08 250/214.1 |

* cited by examiner

*Primary Examiner* — Seung C Sohn
(74) *Attorney, Agent, or Firm* — Brinks Gilson & Lione

(57) ABSTRACT

The present disclosure provides an optical module comprising: a photoelectric conversion unit, a first demodulation circuit, and a second demodulation circuit; the first demodulation circuit and the second demodulation circuit are respectively connected to the photoelectric conversion unit; the photoelectric conversion unit is configured to convert the received optical signal into an electrical signal; the first demodulation circuit is configured to demodulate an electrical signal converted by the photoelectric conversion unit and generate a high-frequency electrical signal; the second demodulation circuit is configured to demodulate an electrical signal converted by the photoelectric conversion unit and generate a low-frequency electrical signal.

21 Claims, 12 Drawing Sheets

OPTICAL MODULE

CROSS-REFERENCE TO RELATED APPLICATIONS

This application is a continuation-in-part application of U.S. patent application Ser. No. 15/394,659 filed on Dec. 29, 2016, which claims priority to Chinese Patent Application No. 201610813775.X, filed on Sep. 9, 2016 and entitled "Optical Module", both of which are incorporated by reference in their entireties.

TECHNICAL FIELD

The present disclosure relates to electronic technology and, more particularly, to an optical module.

BACKGROUND

With the development of optical fiber communication technology, in the field of optical fiber communication, it is required to load low-frequency signal on the original high-speed service channel. For example, the International Organization for Standardization, FSAN, proposed to add an Auxiliary Management and Control Channel (AMCC) to a point-to-point dense wavelength division multiplexing passive optical network. The transmission rate of AMCC is generally below 100 Kbit/s, i.e., belonging to low-frequency signal. Therefore, PTP WDM PON network is required to bear both the original high-speed service signal and low-frequency signal such as AMCC.

In the PTP WDM PON network, the optical signal is received and transmitted by an optical module. However, in the prior art, the optical module can only receive and transmit the high-frequency digital service signal, but cannot receive or transmit the low-frequency signal.

Therefore, the optical module in the prior art cannot meet the requirement of bearing both the high-frequency signal and the low-frequency signal simultaneously.

SUMMARY

The present application provides an optical module including a photoelectric conversion unit, a first demodulation circuit, and a second demodulation circuit;

the first demodulation circuit and the second demodulation circuit are respectively connected to the photoelectric conversion unit;

the photoelectric conversion unit is configured to convert the received optical signal into an electrical signal;

the first demodulation circuit is configured to demodulate an electrical signal converted by the photoelectric conversion unit and generate a high-frequency electrical signal;

the second demodulation circuit is configured to demodulate the electrical signal converted by the photoelectric conversion unit and generate a low-frequency electrical signal.

The optical module provided by the present application includes the photoelectric conversion unit, the first demodulation circuit, and the second demodulation circuit. After the photoelectric conversion unit converts the received optical signal into an electrical signal, the first demodulation circuit and the second demodulation circuit demodulate the electrical signal and generate a high-frequency and a low-frequency electrical signal respectively, and output the high-frequency and the low-frequency electrical signal to the subsequent devices for use. So that the optical module can bear both the high-frequency signal and the low-frequency signal to meet the requirements of bearing both high-frequency and low-frequency signal in the practical application.

In addition, the first demodulation circuit and the second demodulation circuit in the optical module provided in the present application are independent from each other, that is, a circuit that demodulates low-frequency signal is added on the basis of the original circuit that demodulates high-frequency signal circuit, therefore it is possible to ensure that the original demodulation for high-frequency signal is not affected and guarantee a good sensitivity of the optical module.

BRIEF DESCRIPTION OF DRAWINGS

A brief introduction will be given hereinafter to the accompany drawings which will be used in the description of the present application or related art in order to explain the technical solutions of the present application or related art more clearly. Apparently, the drawings in the description below are merely illustrating some embodiments of the present application. Those skilled in the art may obtain other drawings according to these drawings without paying any creative labor.

DESCRIPTION OF EMBODIMENTS

In order to make the purposes, the technical solutions and the advantages of the present application clearer, a clear and full description will be given to the technical solution of the present application with reference to the accompanying drawings. Obviously, the described embodiments are only part of the embodiments of the present application, rather than all of them. According to the embodiments of the present application, all of the other embodiments obtained by those with ordinary skill in the art without consuming any creative work fall within the protection scope of the present application.

Figure 1:
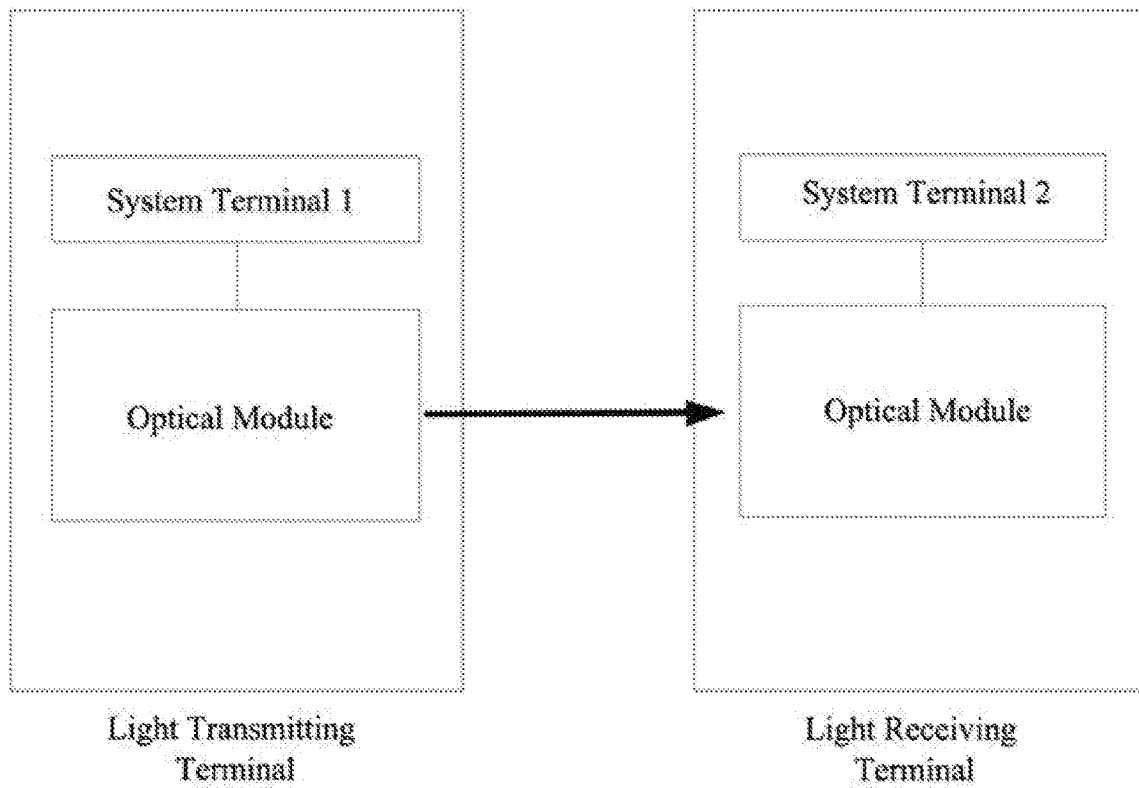
FIG. 1 is a schematic diagram of optical communication interaction of optical modules.

An optical module is a kind of photoelectric conversion device, and the optical communication using optical modules is an interactive communication. FIG. 1 is a schematic diagram of optical communication interaction of optical modules. As shown in FIG. 1, at a light transmitting terminal, an optical module is connected to a system terminal 1, such as a switch, receives an electrical signal from the system terminal 1, and converts the electrical signal into an optical signal for output, and inputs the optical signal into an optical waveguide, such as an optical fiber, to realize information transmitting. At a light receiving terminal, an optical module is connected to a system terminal 2, such as a switch, receives the optical signal from the transmitting terminal, converts the optical signal into an electrical signal and outputs it to the system terminal 2. In this case, the system terminal 1 and the system terminal 2 may include a switch, an optical network terminal set-top box, an optical line terminal set-top box, or the like.

The present application relates mainly to the optical module of the light receiving terminal, that is, a structure in which the optical module receives, converts and demodulates optical signal.

Figure 2:
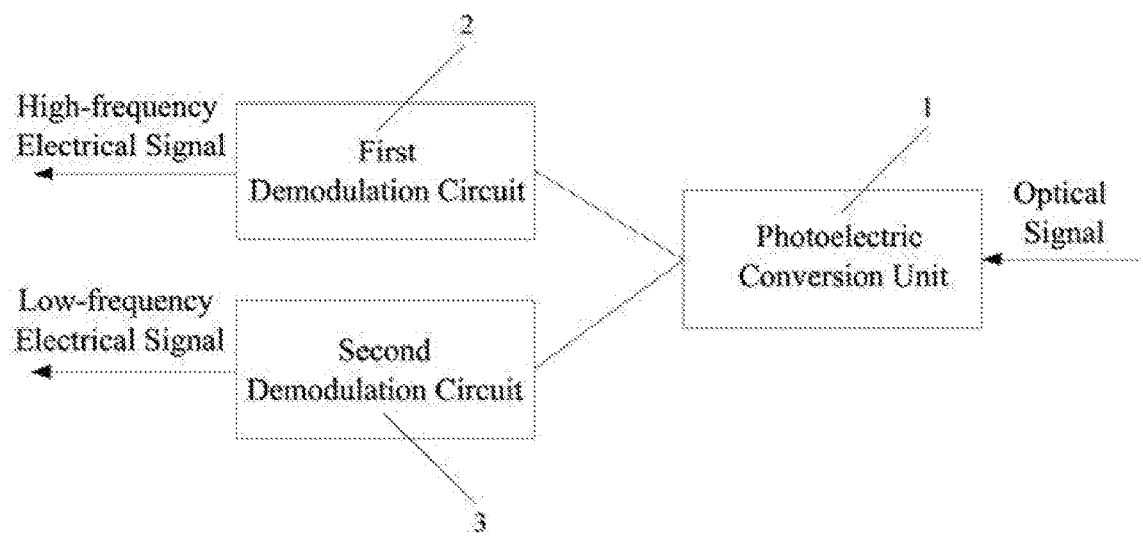
FIG. 2 is a structural diagram of an optical module according to some embodiments of the present application.

FIG. 2 is a structural diagram of an optical module according to some embodiments of the present application. As shown in FIG. 2, an optical module includes a photoelectric conversion unit 1, a first demodulation circuit 2, and a second demodulation circuit 3.

The first demodulation circuit 2 and the second demodulation circuit 3 are respectively connected to the photoelectric conversion unit 1.

In this case, the photoelectric conversion unit 1 is configured to convert the received optical signal into an electrical signal.

The photoelectric conversion unit 1 receives the optical signal transmitted from the Optical Line Terminal (OLT). The optical signal transmitted by the OLT may be a subcarrier modulated optical signal formed by the high-frequency signal and the low-frequency signal. The optical signal may be demodulated by the optical module to get a high-frequency signal and a low-frequency electrical signal.

The optical module receives the optical signal transmitted by the OLT through the photoelectric conversion unit 1. After the receiving, the optical module 1 converts the optical signal into an electrical signal. The electrical signal is a current signal. The photoelectric conversion unit 1 uses the photoelectric effect to convert the light with optical power changes into a current signal with current value changes which will then be demodulated by a subsequent circuit.

The first demodulation circuit 2 is configured to demodulate an electrical signal converted by the photoelectric conversion unit 1 and generate a high-frequency electrical signal.

The second demodulation circuit 3 is configured to demodulate an electrical signal converted by the photoelectric conversion unit 1 and generate a low-frequency electrical signal.

The first demodulation circuit 2 and the second demodulation circuit 3 are two circuits which are independent from each other and are connected to the photoelectric conversion unit 1, respectively. The first demodulation circuit 2 generates a high-frequency electrical signal through an internal device, and the second demodulation circuit 3 generates a low-frequency electrical signal through an internal device. In this case, the high-frequency electrical signal refers to a high-speed data service signal, the rate of which can reach 10 Gbps, while the low-frequency electrical signal refers to the signal can support AMCC function, the rate of which can be less than 100 kbps.

Optionally, the high-frequency electrical signal generated by the first demodulation circuit 2 through the internal device may be a digital signal or an analog signal, and may be processed by the back-end device that receives the high-frequency electrical signal as necessary. For example, if the high-frequency electrical signal is a digital signal and the back-end device that receives the high-frequency electrical signal needs to use an analog signal, then the back-end device may first perform digital-to-analogue conversion. If the high-frequency electrical signal is a digital signal and the back-end device that receives the high-frequency electrical signal also needs to use a digital signal, then the back-end device can directly use the digital signal. The low-frequency electrical signal generated by the second demodulation circuit 3 through the internal device may be an AMCC signal, that is, a signal that can support AMCC function, in particular, such as a digital signal, a square signal, a sawtooth signal, an analog signal or the like.

It should be noted that the present application does not limit the type of the generated low-frequency electrical signal. Any type of the low-frequency electrical signal that differs from the high-frequency digital signal, can be demodulated by the optical module provided by the present application and be output.

Optionally, the foregoing photoelectric conversion unit 1 can be an avalanche photo diode (APD) or a PIN photo diode.

In the embodiment of the present application, the optical module includes the photoelectric conversion unit, the first demodulation circuit, and the second demodulation circuit. After the photoelectric conversion unit converts the received optical signal into the electrical signal, the first demodulation circuit and the second demodulation circuit demodulate the electrical signal and generate a high-frequency signal and a low-frequency electrical signal respectively, and output them to the subsequent device for use. So that the optical module can bear both the high-frequency signal and the low-frequency signal, which meets the requirements of bearing both high-frequency signal and low-frequency signal in the practical application.

In addition, in the embodiments of the present application, the first demodulation circuit and the second demodulation circuit are independent from each other. That is, a circuit for demodulating the low-frequency signal is added on the basis of the original circuit for demodulating high-frequency signal circuit, therefore it is possible to ensure that the original demodulation for high-frequency signal is not affected and guarantee a good sensitivity of optical module.

Figure 3:
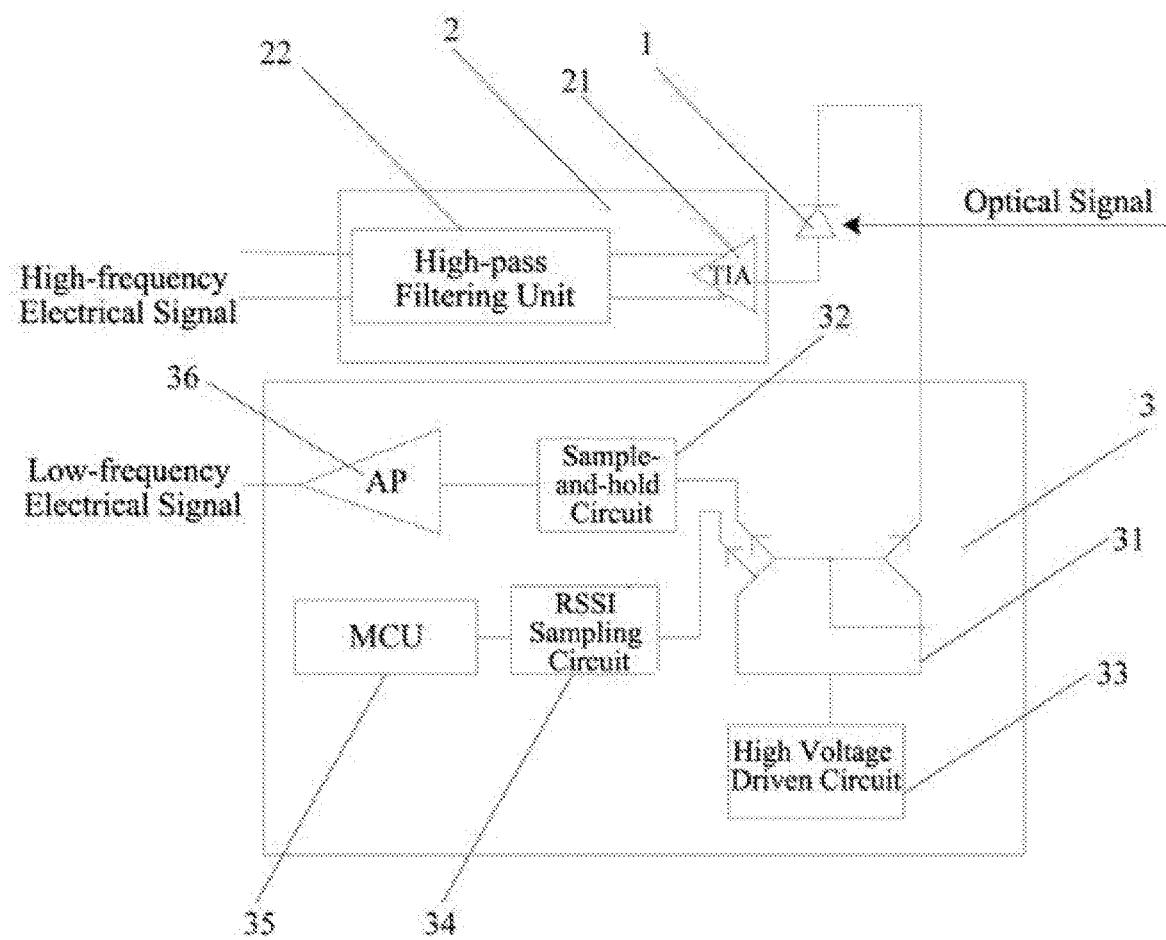
FIG. 3 is a structural diagram of another optical module according to some embodiments of the present application.

FIG. 3 is a structural diagram of another optical module according to some embodiments of the present application. As shown in FIG. 3, the first demodulation circuit 2 includes a transimpedance amplifier 21 and a high-pass filtering unit 22. In this case, the transimpedance amplifier 21 is connected to the photoelectric conversion unit 1, and the high-pass filtering unit 22 is connected to the transimpedance amplifier 21.

The transimpedance amplifier 21 is configured to convert a current signal output from the photoelectric conversion unit 1 into a voltage signal for output, while the high-pass filtering unit 22 is configured to perform high-pass filtering on the voltage signal output from the transimpedance amplifier 21.

The transimpedance amplifier 21 can not only convert the current signal output by the photoelectric conversion unit 1 into a voltage signal, but also can perform the preliminary amplification on the converted voltage signal.

The high-pass filtering unit 22 is mainly used for performing high-pass filtering on the voltage signal output from the transimpedance amplifier 21.

Figure 4:
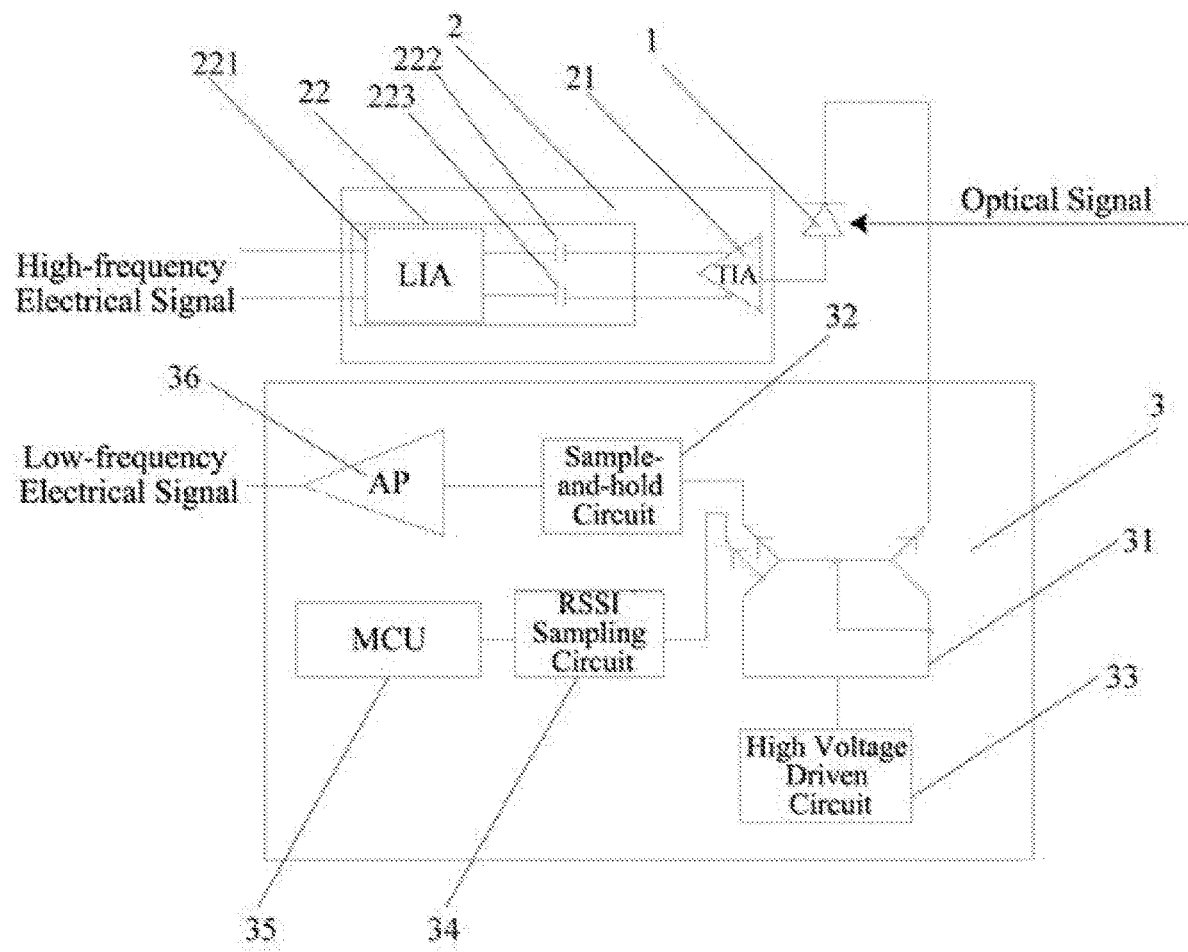
FIG. 4 is a structural diagram of yet another optical module according to some embodiments of the present application.

The high-pass filtering unit 22 may be embodied in several ways, among which one is shown as FIG. 4. FIG. 4 is a structural diagram of yet another optical module according to some embodiments of the present application. As shown in FIG. 4, the high-pass filter unit 22 includes a limiting amplifier (LIA) 221, a first capacitor 222, and a second capacitor 223.

The first capacitor 222 is connected to the transimpedance amplifier 21, while the second capacitor 223 is connected to the transimpedance amplifier 21.

The limiting amplifier 221 is connected to the first capacitor 222 and the second capacitor 223, respectively.

The transimpedance amplifier 21 outputs two differential signals. One end of the first capacitor 222 and one end of the second capacitor 223 are connected to the two differential signal outputs of the transimpedance amplifier 21, respectively, while the other end of the first capacitor 222 and the other end of the second capacitor 223 are connected to the input of the limiting amplifier 221.

The limiting amplifier 221 is configured to perform high-pass filtering on the voltage signal output by the transimpedance amplifier 21 along with the first capacitor 222 and the second capacitor 223.

The first capacitor 222, the second capacitor 223, and the pull-up resistor integrated in the limiting amplifier 221 constitute a high-pass filter, and when the voltage signal passes through the first capacitor 222, the second capacitor 223 and the limiting amplifier 221, the low-frequency signal within is filtered, thereby achieving high-pass filtering.

Optionally, the first capacitor 222 and the second capacitor 223 can be blocking capacitors, which are configured to remove the DC component in the signal output from the transimpedance amplifier 21, and the subsequent limiting amplifier 221 will further process the signal passed through the first capacitor 222 and the second capacitor 223.

The limiting amplifier 221 is further configured to limit-amplify and output the high-pass filtered voltage signal.

During the operation of the optical module, after the current signal output by the photoelectric conversion unit is received, the transimpedance amplifier converts the current signal into a voltage signal, meanwhile performs preliminary amplification on the voltage signal. Further, when the voltage signal passes through the first capacitor, the second capacitor, and the limiting amplifier, the low-frequency signal therein is filtered, thereby achieving high-pass filtering. Further, the limiting amplifier amplifies the signal according to the voltage signal after high-pass filtered, and the limiting amplifier further outputs the amplified signal to the afterward device, i.e., the system terminal described in FIG. 1, for use.

In some embodiments of the present application, the second demodulation circuit is in the following circuit structure. Reference is still made to FIG. 3 or FIG. 4, the second demodulation circuit 3 includes a current mirroring unit 31 and a sample-and-hold circuit 32.

In this case, the current mirroring unit 31 is connected to the photoelectric conversion unit 1.

The sample-and-hold circuit 32 is connected to the first output end of the current mirroring unit 31.

The current mirroring unit 31 is configured to receive a response current signal of the photoelectric conversion unit 1, perform low-pass filtering on the response current signal, and output a mirror current signal of the response current signal to the sample-and-hold circuit 32.

The sample-and-hold circuit 32 is configured to convert the received mirror current signal into a voltage signal.

In the embodiment of the present application, the current mirroring unit is connected to the photoelectric conversion unit. After the photoelectric conversion unit completes the photoelectric conversion and generates the current signal, the current mirroring unit can receive the response current signal of the photoelectric conversion unit, and perform low-pass filtering on the response current signal, so that the high-frequency signal in the response current signal is filtered. Further, the current mirroring unit outputs a mirror current signal of the low-pass filtered current signal which is further converted to a voltage by the sample-and-hold circuit and is output to a afterward device for use. After the processing by the current mirroring unit and the photoelectric conversion unit, the output signal is a low-frequency signal, such that bearing the low-frequency signal in the optical module is achieved.

Further, reference is still made to FIG. 3, the second demodulation circuit 3 further includes a high voltage driven circuit 33.

In this case, the high voltage driven circuit 33 is connected to the current mirroring unit 31.

The high voltage driven circuit 33 is configured to provide the photoelectric conversion unit 1 with a reverse high voltage through the current mirroring unit 31, so as to enable the photoelectric conversion unit 1 to generate a response current signal.

Further, reference is still made to FIG. 3, the second demodulation circuit 3 further includes: a Received Signal Strength Indication (RSSI) sampling circuit 34 and a Microcontroller Unit (MCU) 35.

In this case, one end of the RSSI sampling circuit 34 is connected to the second output end of the current mirroring unit 31, and the other end of the RSSI sampling circuit 34 is connected to the MCU 35.

The RSSI sampling circuit 34 is configured to monitor the mirror current signal output from the current mirroring unit 31 and send the monitoring result to the MCU 35.

After the current mirroring unit 31 generates a low-pass filtered mirror current signal, the mirror current signal will be output from the first output end and the second output end of the current mirroring unit 31, respectively. In this case, the mirror current signal output from the first output end is input to the foregoing sample-and-hold circuit, and in the embodiment of the present application, the mirror current signal output from the second output end will be input to the RSSI sampling circuit 34. The RSSI sampling circuit 34 can monitor the optical power of the optical signal received by the optical module by monitoring the mirror current signal, and the RSSI sampling circuit 34 reports the monitoring result to the MCU 35 for the subsequent analysis and processing by the MCU.

The high voltage driven circuit 33 can provide a reverse high voltage to the photoelectric conversion unit 1. The high voltage driven circuit 33 is connected to the current mirroring unit 31. In the processing of providing the reverse high voltage to the photoelectric conversion unit 1, noise is generated accordingly. Due to the use of the mirror current source and the fact that the input and the two outputs are independent from each other, the noise generated by the reverse high voltage can be reduced, and therefore the signal validity in the optical module is improved.

Based on some of the foregoing embodiments, in some optional embodiments, the foregoing current mirroring unit 31 can be a mirror current source with reference to FIG. 3.

In this case, the first input end of the mirror current source is connected to the high voltage driven circuit 33, the first output end of the mirror current source is connected to the sample-and-hold circuit 32, the second output end of the mirror current source is connected to the RSSI sampling circuit 34, and a third output end of the mirror current source is connected to the photoelectric conversion unit 1.

In this case, the first output end and the second output end of the mirror current source output a mirror image signal of the response current signal of the photoelectric conversion unit, which is received by the mirror current source, while the third output end of the mirror current source outputs a high voltage signal generated by a high voltage driven circuit. After the high voltage signal is input to the photoelectric conversion unit, the photoelectric conversion unit is enabled to operate and generate a response current signal.

In the process of operation, the mirror current source receives a reverse high voltage from the high voltage driven circuit 33 and outputs it to the photoelectric conversion unit 1, and further receives a response current signal of the photoelectric conversion unit. Since the mirror current source has the characteristic of being able to respond to a slow current, in case that the response current signal is a low-frequency electrical signal, the mirror current source can serve as a low-frequency device, i.e., the mirror current source can only process the low-frequency signal in the response current signal, therefore, the low-pass filtering is achieved only by the characteristic of the mirror current itself without adding an additional low-pass filtering device in the second demodulation circuit. After the mirror current source receives the response current signal, a low-frequency mirror current signal is output from the first output end and the second output end, and the subsequent two mirror current signal is respectively processed by the subsequent devices.

In some optional embodiments, reference is still made to FIG. 3, the second demodulation circuit 3 further includes an operational amplifier 36.

In this case, the operational amplifier 36 is connected to the sample-and-hold circuit 32.

The operational amplifier 36 is configured to amplify the voltage signal output from the sample-and-hold circuit 32.

As mentioned in the above, a low-frequency mirror current signal will be output by the mirror current source, and then be converted by the sample-and-hold circuit into a voltage signal whose value is generally small. If the voltage signal is directly used by the afterward device, then the resolution for the voltage signal by the afterward device will be affected. Therefore, in the embodiment of the present application, an operational amplifier is connected after the sample-and-hold circuit to amplify the voltage signal output from the sample-and-hold circuit, and the amplified voltage signal is output to the afterward device so as to ensure these voltage signals can be processed by the afterward device.

The present disclosure below describes another embodiment of a system including an optical module for receiving an optical signal modulated by at least two frequencies: one high frequency and one low frequency. For example, the high frequency may correspond to a service channel (or data channel) of 10 Gbps or 25 Gbps, or other high-bit-rate channels. The low frequency may, for example, correspond to a signaling or control channel of 50 Kbps or other low frequency channels. The system may use the high frequency modulated optical signal for the service channel and at the same time may use the low frequency modulated optical signal for the signaling or control channel.

Figure 5:
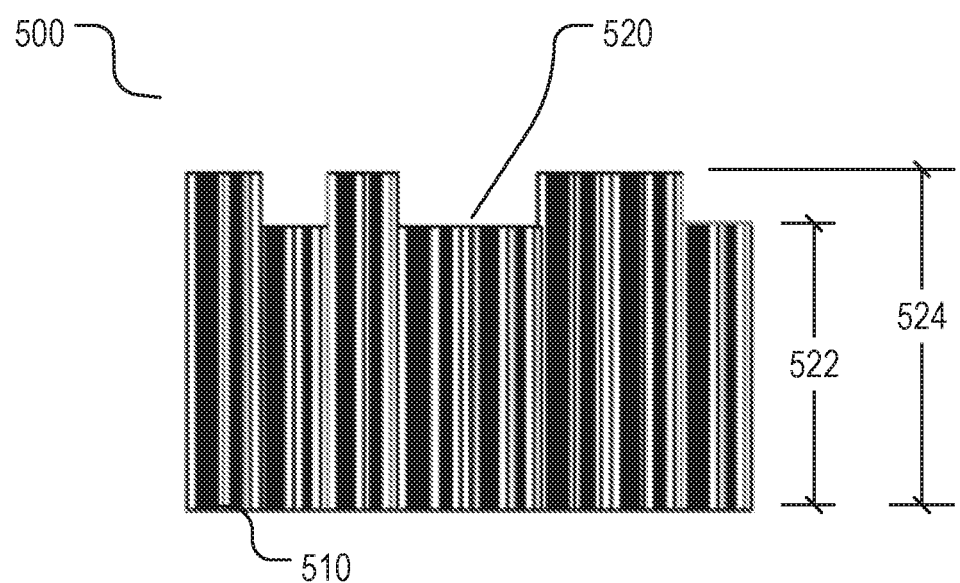
FIG. 5 is a schematic diagram of an optical signal modulated by one high frequency and one low frequency.

An optical signal may be modulated by one high frequency and one low frequency simultaneously. In an exemplary implementation using amplitude modulation, as shown in FIG. 5, the optical signal 500 may include a high frequency component 510 and a low frequency component 520. In one implementation, an optical source such as a laser source maybe directly current modulated at the low frequency. For example, in an EA laser source, the low frequency signal may be coupled to the DC electrical current connected the BIAS. In some implementations, the high frequency component may be produced by external optical modulation or direct current modulation of a laser source.

The low frequency component 520 may be used for the control channel, alternatively referred to as signaling channel. The power P(0) of low-power level 522 may correspond to "0" in the signaling channel, and the power P(1) of high-power level 524 may correspond to "1" in the signaling channel. The modulation depth of the signaling channel may equal to the difference of P(0) and P(1) divided by the summation of P(0) and P(1). The modulation depth may be adjusted by monitoring the P(1) and P(0) with an signal analyzer (for example, an oscilloscope) by passing an electrical signal produced by a light detector to a low-pass filter. The low-pass filter may perform a D.C. coupling to block the high frequency components and passing the low-frequency components.

The optical module for receiving the optical signal may include a high-frequency demodulation circuit and a low-frequency demodulation circuit. The high-frequency demodulation circuit may include a transimpedance amplifier (TIA) and a limiting amplifier (LA), and may demodulate the optical signal to obtain a high frequency signal. The low-frequency demodulation circuit may demodulate the optical signal to obtain a low frequency signal transmitted.

Figure 6:
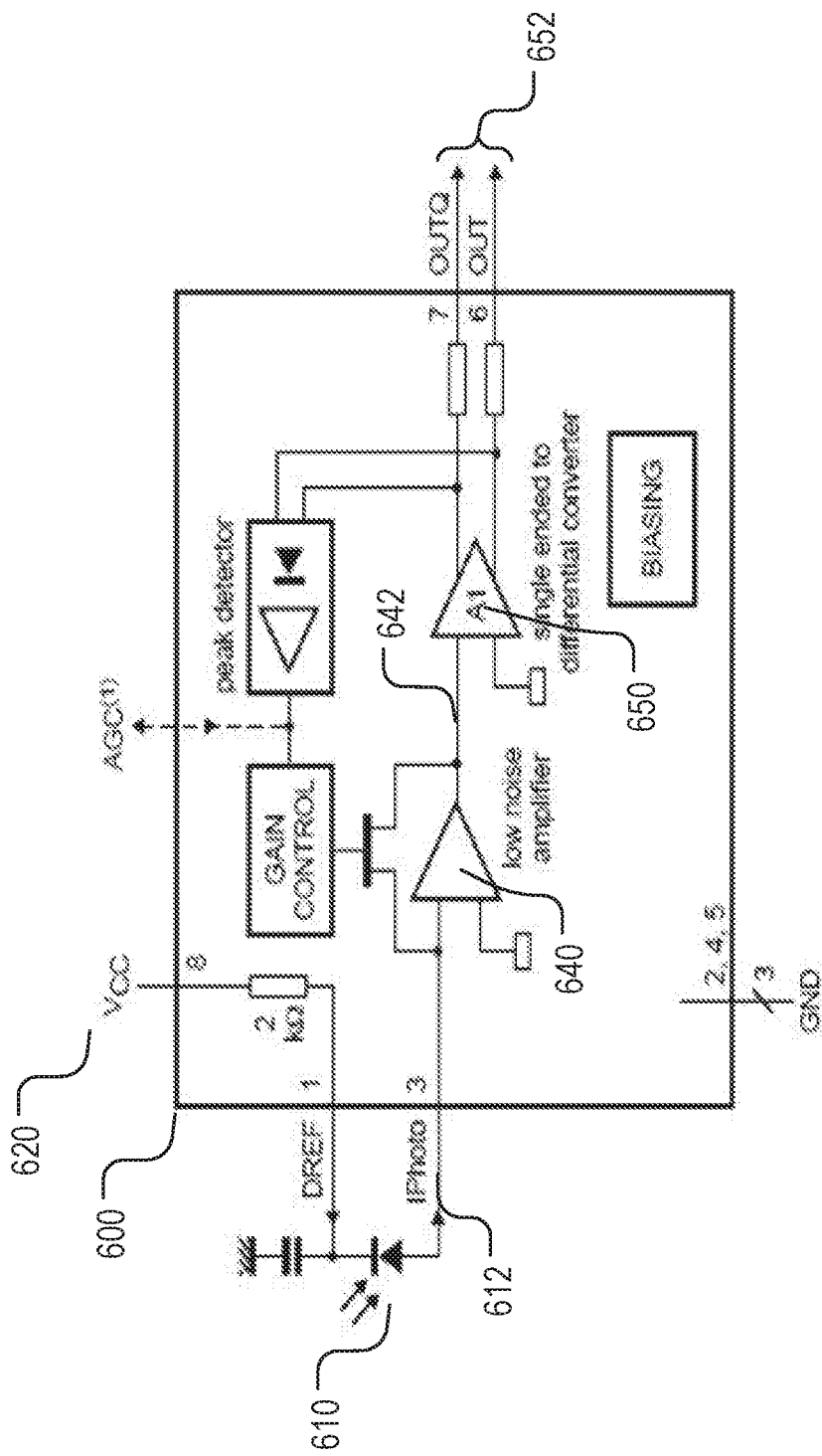
FIG. 6 is a structural diagram of a transimpedance amplifier according to some embodiments of the present application.

In one implementation, the transimpedance amplifier may include a circuit 600 as shown in FIG. 6. The circuit 600 may include a light detector 610 and its power supply 620. The light detector 610 may receive the optical signal and output an electrical signal 612. The light detector 610 may include but is not limited to a photodiode (PD) or an avalanche photodiode (APD). The power supply 620 may be a standard voltage or current power supply or a high voltage power supply for APD.

In one implementation, the electrical signal 612 may be an electrical current signal. The transimpedance amplifier circuit 600 may include an amplifier 640 for converting the electrical current signal 612 to an electrical voltage signal 642. The amplifier 640 may be a low-noise operational amplifier, and one of its input terminals may connect to the output terminal of the light detector 610. The transimpedance amplifier 600 may include a differential amplifier 650 for converting the electrical voltage signal 642 to a differential voltage output 652.

Figure 7:
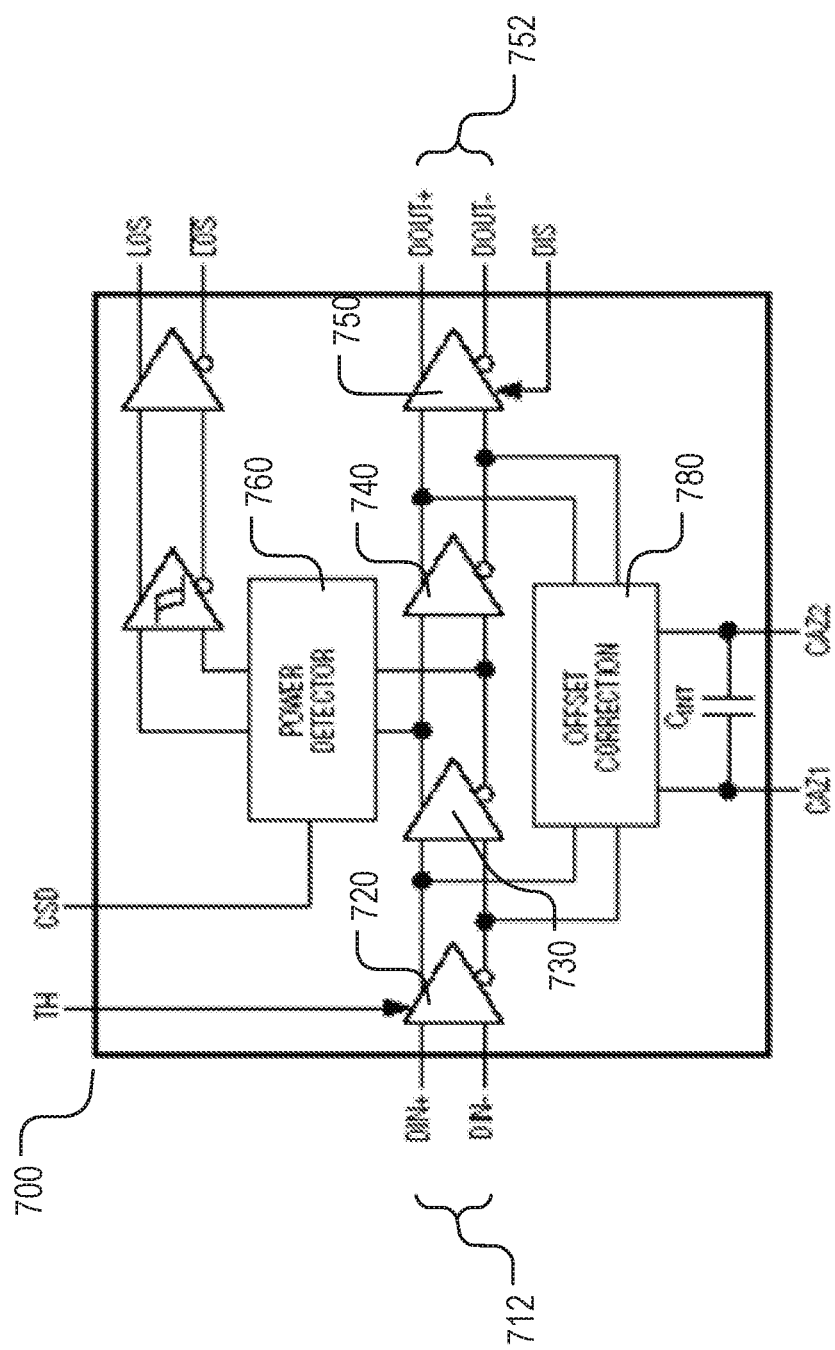
FIG. 7 is a structural diagram of a limiting amplifier according to some embodiments of the present application.

In one implementation, the limiting amplifier may include a circuit 700 as shown in FIG. 7. The limiting amplifier 700 may receive the differential voltage signal 712 from the transimpedance amplifier, amplify the voltage signal but limit the final output within a pre-determined range, so as to output a differential voltage output 752. The limiting amplifier may include a power detector 760, an offset correction 780, and a plurality of amplifiers (for example, four operational amplifiers as 720, 730, 740, and 750).

Figure 8A:
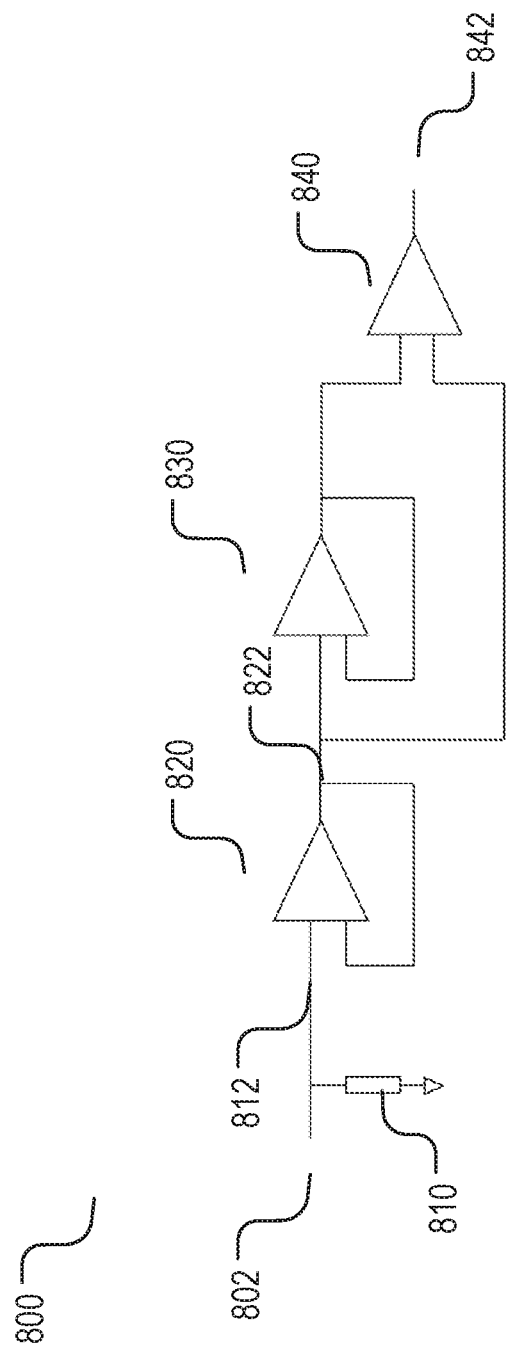
FIGS. 8A and 8B are structural diagrams of a low-frequency demodulation circuit according to some embodiments of the present application.
Figure 8B:
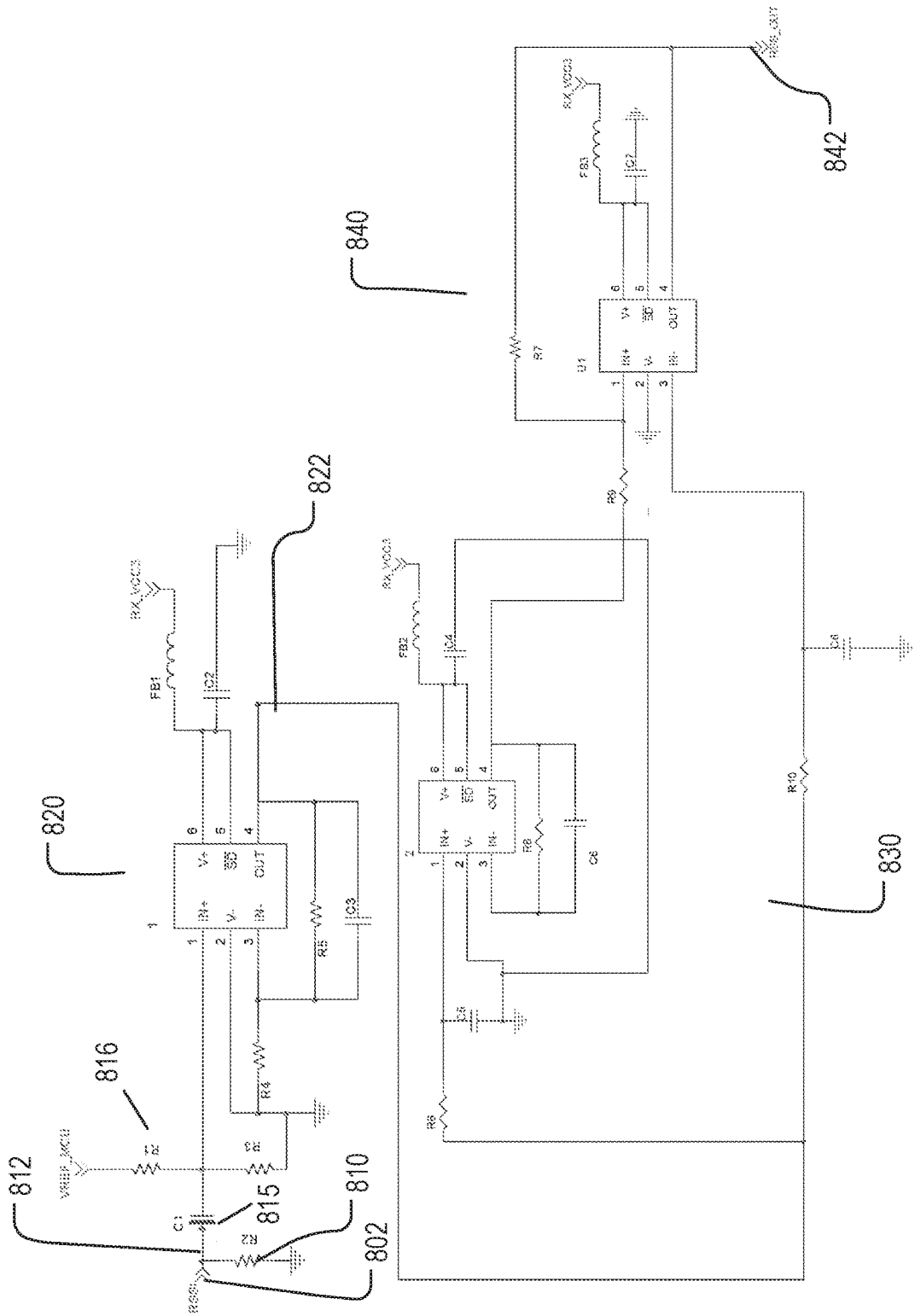

FIGS. 8A-8B show an exemplary implementation of the low-frequency demodulation circuit. FIGS. 9A-9F show corresponding signal waveforms at various stage within the low-frequency demodulation circuit 800 of FIG. 8. Specifically and as shown in FIGS. 8A and 8B, the exemplary low-frequency demodulation circuit 800 may include a circuit for receiving an electrical signal from a light detector and demodulate the electrical signal to obtain a low-frequency signal. In one implementation, an electrical current signal 802 may be an output signal from a PD or APD upon receiving an optical signal. In another implementation, an electrical current signal 802 may be an output signal from a Received Signal Strength Indications (RSSI) circuit, which may collect an output signal from a PD or APD upon receiving an optical signal.

The demodulation circuit in FIG. 8A or FIG. 8B may receive any type of analog electrical signal, for example, an electrical current signal or an electrical voltage signal, and convert the analog electrical signal to a digital signal. For one example, the demodulation circuit may receive an analog electrical signal directly from a light detector. For another example, the demodulation circuit may receive an analog electrical signal pre-processed by another electrical circuit, for example, a RSSI circuit or other types of circuit.

Figure 9A:
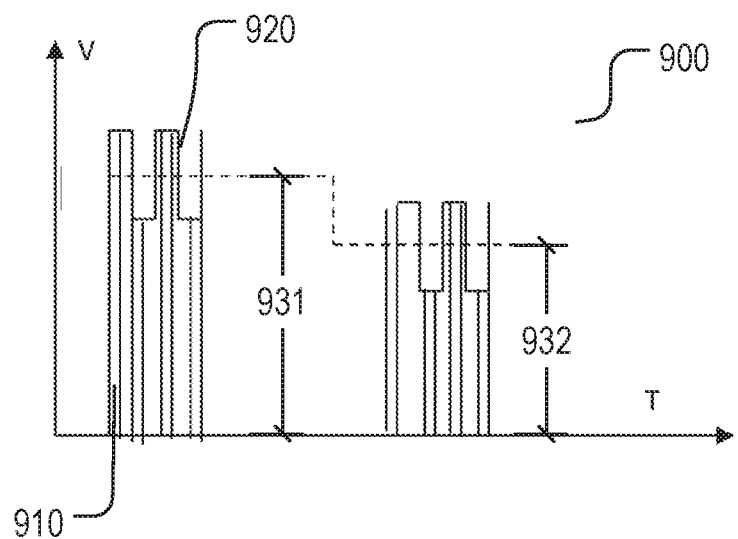
FIGS. 9A-9F are schematic diagrams of an electrical signal according to some embodiments of the present application.

In conventional implementations, when a power of an optical signal drifts, the D.C. components of the electrical signal produced by a light detector for the optical signal may drift. Such drifting may complicate a conversion from an analog signal to a digital signal and decrease the processing speed and efficiency. For example and as shown in FIG. 9A, the D.C. components of the electrical signal may be 931 at some time period and then may drift to 932 at other time period. The present disclosure describes a low-frequency demodulation circuit that overcomes complications caused by this drafting.

In more detail, the low-frequency demodulation circuit 800 may include a resistor 810 to convert the electrical current signal 802 to an electrical voltage signal 812. The low-frequency demodulation circuit may include a low-pass amplifier 820 to filter out high-frequency signals and amplify low-frequency signals to produce an amplified low-frequency electrical voltage signal 822. Here, the low frequency may include a frequency on the same order as the frequency of signaling channel, for example, on the order of about 100 KHz or 1 MHz. The high frequency may include a frequency on the same order as the frequency of service or data channel, for example, on the order of about 1 GHz or 10 GHz. The low-pass amplifier 820 may have a cut-off frequency of, for example, 200 KHz or 1 MHz.

In one implementation, the low-pass amplifier 820 may be a low-pass filter circuit when the electrical voltage signal 812 comprises sufficient signal strength. The low-pass filter circuit may block high-frequency components and allow low-frequency components to pass through. In another implementation, the low-pass amplifier 820 may be optional when the electrical voltage signal 812 comprises sufficient signal strength.

The amplified low-frequency electrical voltage signal 822 may directly connect to one input terminal of a comparator 840, and may pass through a low-pass filter 830 and then connect to another input terminal of the comparator 840. The low-pass filter 830 may filter out alternative current (A.C.) component in the amplified low-frequency electrical voltage signal 822 and only allow D.C. component to pass through. The comparator 840 may compare the difference of the voltage inputs at the two input terminals to produce discrete high or low voltage levels.

The electrical signal corresponding to an optical signal may have a form as shown in 900 of FIG. 9A. The electrical signal 900 may include a high frequency signal 910 and a low frequency signal 920. Due to the power shifting or drifting of an optical signal, the electrical signal 900 may have a shifting of D.C. component that shifts, for example, between 931 and 932.

Figure 9B:
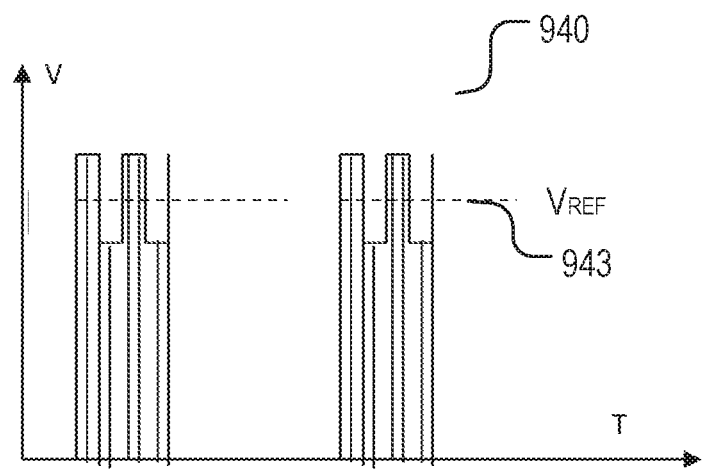

In one implementation, the low-frequency demodulation circuit may preform A.C. coupling by including a capacitor C1 815. The capacitor C1 815 may block D.C. components in the electrical voltage signal 812 and allow A.C. components to pass through. Optionally, the low-frequency demodulation circuit may also include a D.C. offset circuit 816 to offset the A.C. components relative to a reference voltage ($V_{REF}$). Therefore, the electrical signal 900 shown in FIG. 9A may be converted to an electrical signal 940 as shown in FIG. 9B, having an adjusted D.C. component of $V_{REF}$ 943 that is not affected by the drifting of the optical signal.

Figure 9C:
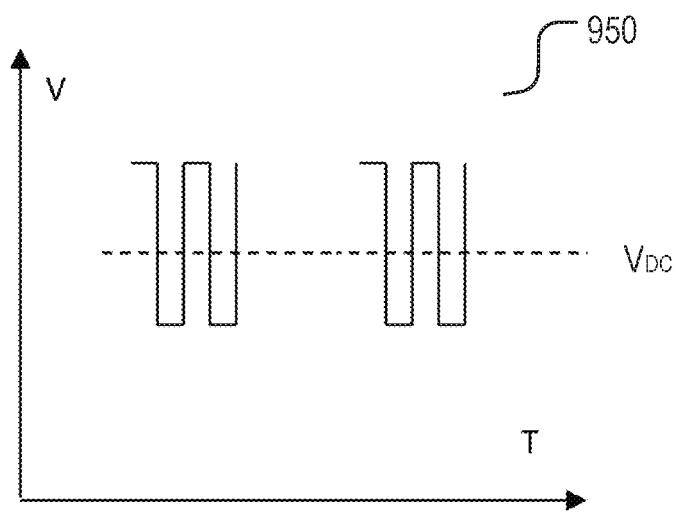

The low-frequency demodulation circuit may pass the electrical signal 940 through a low-pass amplifier 820 to block high frequency components and amplify the low-frequency components to generate an electrical signal 950 as shown in FIG. 9C. The electrical signal 950 may have a D.C. component of $V_{DC}$.

Figure 9D:
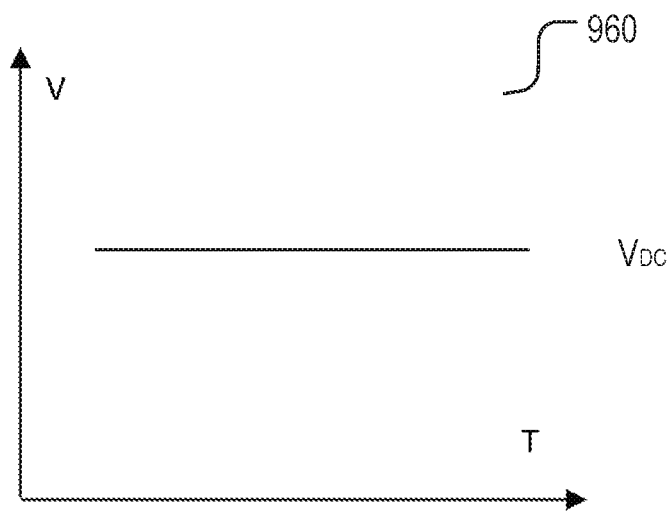

The low-frequency demodulation circuit may further pass the electrical signal 950 through a low-pass filter 830 to filter out A.C. components and only allow D.C. components in the electrical signal 950 passing through, so as to generate an electrical signal 960 as shown in FIG. 9D. For example, the low-pass filter 830 may include a resistor-capacitor (RC) low-pass filter circuit.

Figure 9E:
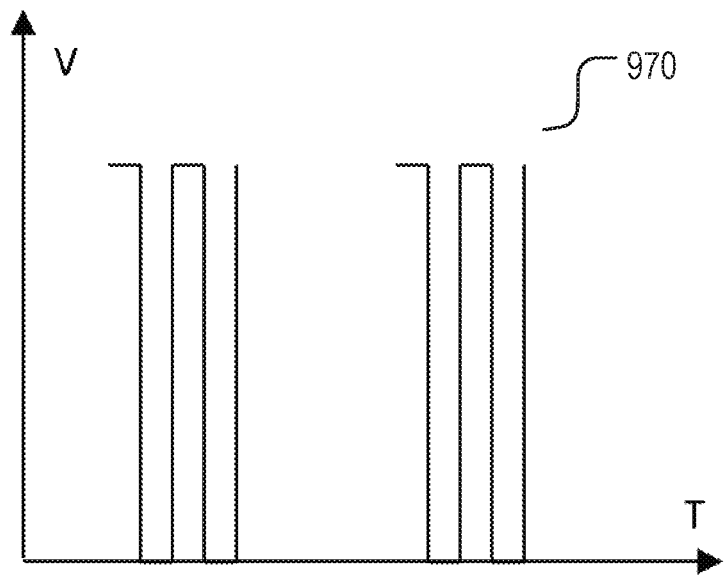

The low-frequency demodulation circuit may pass the electrical signal 950 and electrical signal 960 through a comparator 840 to compare the difference of the two inputs to produce an electrical signal 970 as shown in FIG. 9E. The electrical signal 970 is quasi-binary and thus may be efficiently processed by a microprocessor without much complication.

Figure 9F:
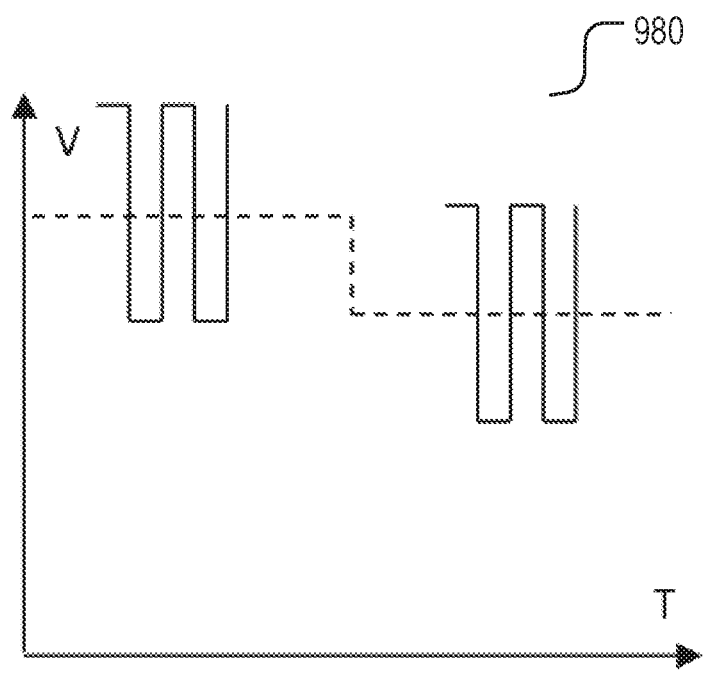

In another implementation, the low-frequency demodulation circuit may preform D.C. coupling so as to convert the electrical signal 900 shown in FIG. 9A to an electrical signal 980 as shown in FIG. 9F. Then the low-frequency demodulation circuit may preform similar operations as in the A.C. coupling so as to filter out the drifting D.C. levels and produce output similar to 970 of FIG. 9E.

Figure 10:
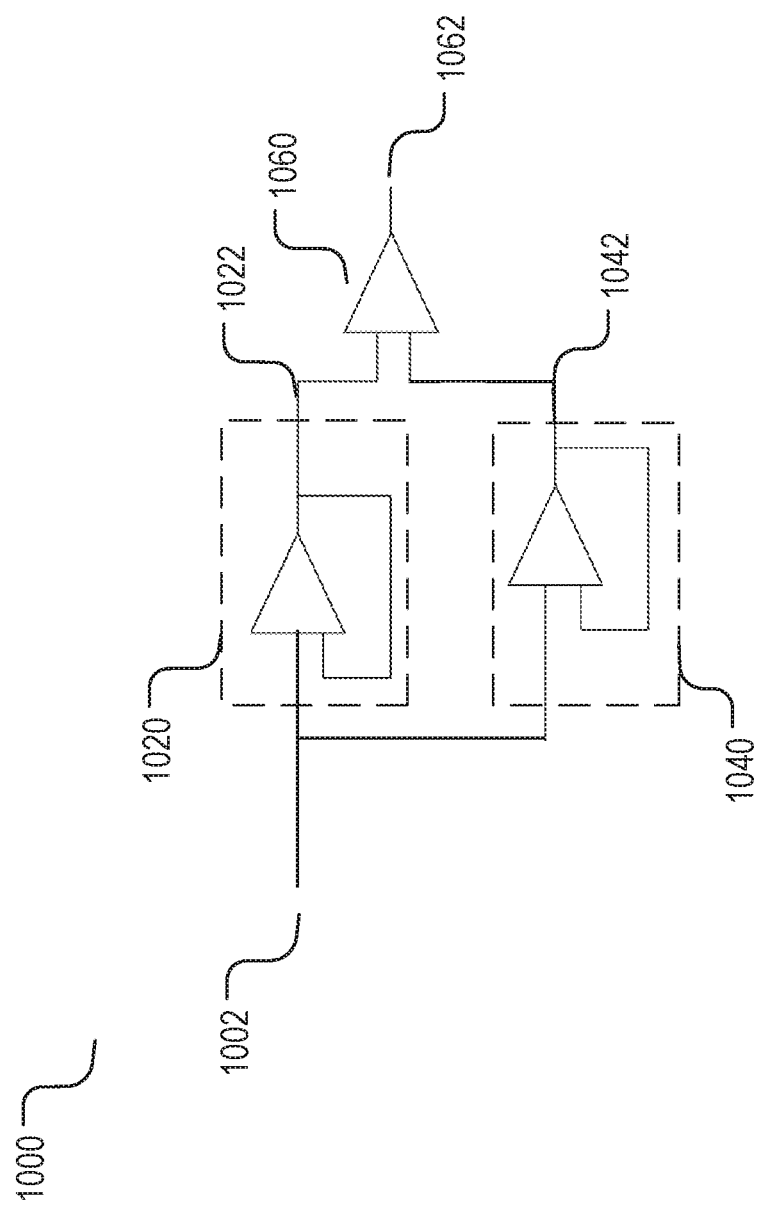
FIG. 10 is a structural diagram of a low-frequency circuit according to some embodiments of the present application.

The present disclosure describes another embodiment of an electric circuit 1000, as shown in FIG. 10, for converting a low-frequency component of an analog electrical signal to a digital electrical signal. The electric circuit may include a first low-pass filter 1020, a second low-pass filter 1040, and a comparator 1060.

The first low-pass filter 1020 and the second low-pass filter may have different cut-off or low-passing frequencies. For example, the first low-pass filter 1020 may have a lower cut-off frequency than the second low-pass filter 1040. Optionally, the first low-pass filter 1020 may be a low-pass amplifier, and the second low-pass filter 1040 may be another low-pass amplifier.

In one implementation, the first low-pass filter 1020 may block A.C. components of input electrical signal 1002 and allow signal near D.C. component to pass through (a slowly drifting D.C level, for example). Thus, the first signal 1022 may include the D.C. component of the input electrical signal. The second low-pass filter 1040 may block high-frequency components of the input electrical signal 1002 and allow low-frequency components to pass through. Thus the second signal 1042 may include the low-frequency components of the input electrical signal.

The comparator 1060 may receive the first signal 1022 and the second signal 1042, and output a quasi-binary signal 1062. The quasi-binary signal 1062 may be efficiently processed by other digital signal processing unit without much complication.

Finally, it should be noted that the foregoing embodiments are merely intended for describing the technical solutions of the present application rather than limiting the present application. Although the present application is described in detail with reference to the foregoing embodiments, persons of ordinary skill in the art should understand that they may still make modifications to the technical solutions described in the foregoing embodiments, or make equivalent replacements to some or all technical features therein; however, these modifications or replacements do not make the essence of corresponding technical solutions depart from the scope of the technical solutions in the embodiments of the present application.

What is claimed is:

1. An optical module, comprising: a photoelectric conversion unit, a first demodulation circuit, and a second demodulation circuit separate from the first demodulation circuit; wherein
the first demodulation circuit and the second demodulation circuit are respectively connected to the photoelectric conversion unit;
the photoelectric conversion unit is configured to convert a received optical signal into an electrical signal, wherein the electrical signal comprises a high-frequency electrical signal and a low-frequency electrical signal;
the first demodulation circuit is configured to demodulate the electrical signal converted by the photoelectric conversion unit and generate a high-frequency electrical signal; and
the second demodulation circuit is configured to demodulate the electrical signal converted by the photoelectric conversion unit and generate a low-frequency electrical signal.

2. The optical module according to claim 1, wherein the first demodulation circuit comprises a transimpedance amplifier circuit and wherein:
the transimpedance amplifier circuit is electrically connected to the photoelectric conversion unit, and is configured to convert a current signal output from the photoelectric conversion unit into a voltage signal comprising the high-frequency electrical signal.

3. The optical module according to claim 2, wherein the transimpedance amplifier circuit comprises:
a current-to-voltage conversion amplifier electrically connected to the photoelectric conversion unit, wherein the current-to-voltage conversion amplifier is configured to convert the current signal output from the photoelectric conversion unit into an intermediate voltage signal.

4. The optical module according to claim 3, wherein the transimpedance amplifier circuit further comprises:
a differential amplifier electrically connected to the current-to-voltage conversion amplifier, wherein the differential amplifier is configured to convert the intermediate voltage signal from the current-to-voltage conversion amplifier to a differential voltage output comprising the high-frequency electrical signal.

5. The optical module according to claim 2, wherein the first demodulation circuit further comprises a limiting amplifier and wherein
the limiting amplifier is electrically connected to the transimpedance amplifier circuit, and is configured to convert the voltage signal from the transimpedance amplifier circuit to a limiting amplified voltage signal comprising the high-frequency electrical signal.

6. The optical module according to claim 5, wherein the limiting amplifier comprises one or more cascading amplifiers to amplify the voltage signal from the transimpedance amplifier circuit to obtain the limiting amplifier voltage signal.

7. The optical module according to claim 6, wherein the limiting amplifier further comprises power detector for connected to an intermediate output of the one or more cascading amplifiers.

8. The optical module according to claim 6, wherein the limiting amplifier further comprises an offset correction circuit.

9. The optical module according to claim 1, wherein the second demodulation circuit comprises a current-to-voltage conversion circuit and wherein:
the current-to-voltage conversion circuit electrically connects to the photoelectric conversion unit; and
the current-to-voltage conversion circuit is configured to convert a signal output from the photoelectric conversion unit into a voltage signal.

10. The optical module according to claim 9, wherein the voltage signal comprises the high-frequency electrical signal and the low-frequency electrical signal.

11. The optical module according to claim 9, wherein the second demodulation circuit further comprises an alternative-current (A.C.) coupling circuit configured to block a direct-current (D.C.) component in the voltage signal and allow an A.C. component to pass through.

12. The optical module according to claim 9, wherein:
the second demodulation circuit further comprises a low-pass amplifier, wherein the low-pass amplifier electrically connects to the current-to-voltage conversion circuit, and is configured to filter out high-frequency signal and amplify a low-frequency signal to produce an amplified low-frequency electrical voltage signal.

13. The optical module according to claim 12, wherein the amplified low-frequency electrical voltage signal comprises a direct-current (D.C.) component and the low-frequency electrical signal.

14. The optical module according to claim 12, wherein:
the second demodulation circuit further comprises a low-pass filter comprising an input terminal and an output terminal, wherein the input terminal of the low-pass filter electrically connects to the low-pass amplifier and the low-pass filter is configured to filter out an A.C. component and allow a D.C. component passing through; and
the second demodulation circuit comprises a comparator comprising a first input terminal and a second input terminal, wherein:
the first input terminal of the comparator electrically connects to the low-pass amplifier and is configured to receive the amplified low-frequency electrical voltage signal,
the second input terminal of the comparator electrically connects to the output terminal of the low-pass filter, and
the comparator is configured to output a quasi-binary electrical signal.

15. The optical module according to claim 14, wherein:
the amplified low-frequency electrical voltage signal comprises a direct current (D.C.) component and the low-frequency electrical signal;
electric signal at the output terminal of the low-pass filter comprises the D.C. component of the amplified low-frequency electrical voltage signal; and
the quasi-binary electrical signal comprises the low-frequency electrical signal.

16. The optical module according to claim 9, wherein the current-to-voltage conversion circuit comprises a resistor.

17. The optical module according to claim 1, wherein:
the second demodulation circuit comprises a first low-pass filter with a first cut-off frequency, a second low-pass filter with a second cut-off frequency, and a comparator, wherein:
- an input terminal of the first low-pass filter electrically connects to the photoelectric conversion unit and is configured to receive the electrical signal from the photoelectric conversion unit and output a first signal;
- an input terminal of the second low-pass filter electrically connects to the photoelectric conversion unit and is configured to receive the electrical signal from the photoelectric conversion unit and output a second signal; and
- the comparator is configured to compare the first signal and the second signal.

18. The optical module according to claim 17, wherein the first cut-off frequency is smaller than the second cut-off frequency.

19. The optical module according to claim 17, wherein:
- the first signal comprises a direct current (D.C.) component of the electrical signal;
- the second signal comprises a low-frequency component of the electrical signal; and
- output signal from the comparator comprises quasi-binary signal.

20. The optical module according to claim 1, wherein:
- a frequency of the high-frequency electrical signal is between 1 GHz and 10 GHz; and
- a frequency of the low-frequency electrical signal is between 50 KHz and 1 MHz.

21. The optical module according to claim 1, wherein the high-frequency electric signal from the first demodulation circuit comprises a differential electric signal wherein as the low-frequency electric signal from the second demodulation circuit comprises a non-differential electric signal.

* * * * *